United States Patent
Cases et al.

[11] Patent Number: 5,777,490
[45] Date of Patent: Jul. 7, 1998

[54] CIRCUITRY AND METHOD FOR TRANSLATING VOLTAGES

[75] Inventors: Moises Cases; Fahd Hinedi, both of Austin, Tex.

[73] Assignee: International Business Machines Corporation, Armonk, N.Y.

[21] Appl. No.: 757,978

[22] Filed: Nov. 27, 1996

[51] Int. Cl.$^6$ ............ H03K 19/094; H03K 19/0185
[52] U.S. Cl. ............................. 326/68; 326/81
[58] Field of Search ........................ 326/68, 70, 71, 326/86, 80, 81

[56] References Cited

U.S. PATENT DOCUMENTS

| | | |
|---|---|---|
| 4,638,182 | 1/1987 | McAdams . |
| 4,709,162 | 11/1987 | Braceras et al. . |
| 4,782,250 | 11/1988 | Adams et al. . |
| 4,937,477 | 6/1990 | Tsoi et al. . |
| 5,029,283 | 7/1991 | Ellsworth et al. . |
| 5,051,625 | 9/1991 | Okeda et al. . |
| 5,206,544 | 4/1993 | Chen et al. . |
| 5,406,140 | 4/1995 | Wert et al. . |
| 5,436,585 | 7/1995 | DiMarco . |
| 5,450,025 | 9/1995 | Shay . |
| 5,453,705 | 9/1995 | Atallah et al. . |
| 5,504,444 | 4/1996 | Neugebauer . |
| 5,528,173 | 6/1996 | Merritt et al. ............... 326/68 |

Primary Examiner—Jon Santamauro
Assistant Examiner—Don Le
Attorney, Agent, or Firm—Michael A. Davis, Jr.; Casimer K. Salys

[57] ABSTRACT

With first semiconductor circuitry, a first signal is received having a first voltage between a voltage A and a voltage B. With second semiconductor circuitry, a second signal is output having a second voltage between a voltage C and a voltage D in response to the first signal. C is greater than A, and D is greater than B.

8 Claims, 1 Drawing Sheet

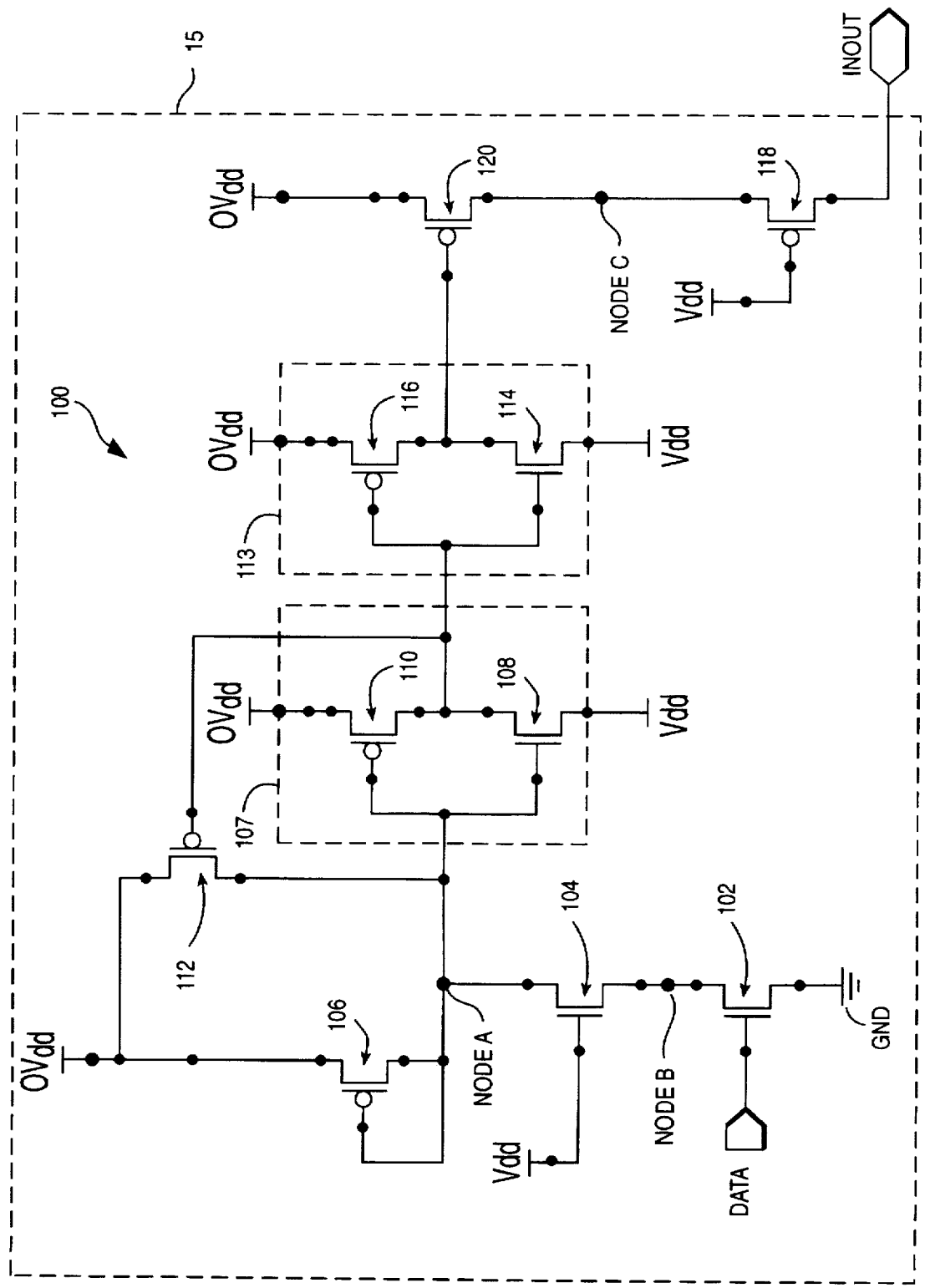

CIRCUITRY AND METHOD FOR TRANSLATING VOLTAGES

TECHNICAL FIELD

This patent application relates in general to electronic circuitry and in particular to a method and circuitry for translating voltages.

BACKGROUND

With advances in semiconductor fabrication techniques, supply voltages and sizes of electronic devices can be reduced. In a typical computer system, a processor is coupled through a system bus to other devices, such as a system memory, an input/output ("I/O") controller, and an application specific integrated circuit ("ASIC"). Relative to these other devices, the processor can be manufactured according to a more advanced semiconductor fabrication technique.

For example, it is possible for normal operating voltages in the processor to range between 0 volts and 1.8 volts while normal operating voltages in the other devices range between 0 volts and 3.3 volts. In such a situation, a logic 1 state is represented by 1.8 volts in the processor and by 3.3 volts in the other devices. In either case, a logic 0 state is represented by 0 volts.

In order to communicate a logic 1 state between the processor and other devices, the system bus can transfer a signal having 3.3 volts. For this reason, the processor includes driver circuitry for translating a 1.8 volt signal from elsewhere within the processor into a 3.3 volt signal for communication through the system bus. Likewise, the processor includes driver circuitry for translating a 3.3 volt signal from the system bus into a 1.8 volt signal for use elsewhere within the processor.

Previous driver circuitry fails to translate voltages in a manner that avoids damage to its transistors under some circumstances, particularly if the processor's maximum voltage is substantially lower than the other devices' maximum voltage(s). For example, some fabrication techniques impose a relatively low predetermined limit on a maximum safe difference between a voltage at a transistor's gate and a voltage at a source/drain region of the transistor. In such a situation, if the transistor's source/drain region has a voltage that differs from a voltage at the transistor's gate by more than the predetermined limit, then the transistor's gate oxide could be damaged in a manner that destroys the transistor's operability.

Thus, a need has arisen for a method and circuitry for translating voltages, in which damage to a transistor is avoided, even if a maximum voltage of a first device (e.g. a processor) is substantially lower than a maximum voltage at a second device, and even if a relatively low predetermined limit is imposed on a maximum safe difference between a voltage at the transistor's gate and a voltage at a source/drain region of the transistor.

SUMMARY

With first semiconductor circuitry, a first signal is received having a first voltage between a voltage A and a voltage B. With second semiconductor circuitry, a second signal is output having a second voltage between a voltage C and a voltage D in response to the first signal. C is greater than A, and D is greater than B.

It is a technical advantage that damage to a transistor is avoided, even if a maximum voltage of a first device (e.g. a processor) is substantially lower than a maximum voltage at a second device, and even if a relatively low predetermined limit is imposed on a maximum safe difference between a voltage at the transistor's gate and a voltage at a source/drain region of the transistor.

BRIEF DESCRIPTION OF THE DRAWING

An illustrative embodiment and its advantages are better understood by referring to the following descriptions and accompanying drawing, in which:

FIG. 1 is a schematic electrical circuit diagram of circuitry for translating voltages according to the illustrative embodiment.

DETAILED DESCRIPTION

An illustrative embodiment and its advantages are better understood by referring to FIG. 1 of the drawing.

FIG. 1 is a schematic electrical circuit diagram of circuitry, indicated generally at 100, for translating voltages according to the illustrative embodiment. A first supply voltage node Vdd has a voltage of approximately 1.8 volts (+ or −5%) relative to a reference voltage node GND. A second supply voltage node OVdd has a voltage of approximately 3.3 volts (+ or −5%) relative to GND.

A single integrated circuit, indicated by dashed enclosure 15, includes transistors 102, 104, 106, 108, 110, 112, 114, 116, 118 and 120, which are metal oxide semiconductor ("MOS") field effect transistors ("FETs") and, accordingly, are formed integrally with one another within integrated circuitry. Each such FET is a control device having a control node (e.g. a gate) and first and second conducting nodes (e.g. source/drain regions). Each such control device conducts electrical current between its two conducting nodes in response to a logic state of its control node.

Source/drain regions of n channel transistors 102, 104, 108 and 114 are n-type diffusions formed within a p-type substrate which is connected to GND. Source/drain regions of p channel transistors 106, 110, 112, 116, 118 and 120 are p-type diffusions formed within at least one n-type well which is connected to OVdd. Each of transistors 102, 104, 106, 108, 110, 112, 114, 116, 118 and 120 has a channel width-to-length ratio which is substantially optimized in order to suitably account for various aspects of the specific process technology used to fabricate integrated circuit 15.

An information node DATA is connected to a gate of transistor 102. A source of transistor 102 is connected to GND. A drain of transistor 102 is coupled through a Node B to a source of transistor 104. A gate of transistor 104 is connected to Vdd.

A drain of transistor 104 is connected to a Node A. Node A is connected to a drain of transistor 106, to a gate of transistor 106, and to a drain of transistor 112. Further, Node A is connected to an input of an inverter, indicated by dashed enclosure 107.

A source of transistor 106 is connected to OVdd and to a source of transistor 112. An output of inverter 107 is connected to a gate of transistor 112. Further, the output of inverter 107 is connected to an input of an inverter, indicated by dashed enclosure 113. An output of inverter 113 is connected to a gate of transistor 120.

A source of transistor 120 is connected to OVdd. A drain of transistor 120 is coupled through a Node C to a source of transistor 118. A gate of transistor 118 is connected to Vdd. A drain of transistor 118 is connected to an information node INOUT which is connected to other circuitry (not shown in FIG. 1) external to integrated circuitry 15.

Inverter 107 is formed by transistors 108 and 110. A source of transistor 108 is connected to Vdd. A source of transistor 110 is connected to OVdd. Respective gates of transistors 108 and 110 are connected to the input of inverter 107. Respective drains of transistors 108 and 110 are connected to the output of inverter 107.

Inverter 113 is formed by transistors 114 and 116. A source of transistor 114 is connected to Vdd. A source of transistor 116 is connected to OVdd. Respective gates of transistors 114 and 116 are connected to the input of inverter 113. Respective drains of transistors 114 and 116 are connected to the output of inverter 113.

Each of transistors 108 and 114 has a threshold voltage ("Vt") of approximately 0 volts, so the transistor is substantially turned on in response to its gate's voltage being above its source's voltage. Each of transistors 102 and 104 has a Vt of approximately 0.4 volts, so the transistor is substantially turned on in response to its gate's voltage being more than 0.4 volts above its source's voltage. Each of transistors 106, 110, 112, 116, 118 and 120 has a Vt of approximately 0.4 volts, so the transistor is substantially turned on in response to its gate's voltage being more than 0.4 volts below its source's voltage.

In operation, a voltage at DATA varies between approximately 0 volts and 1.8 volts, whereas a voltage at INOUT varies between a tri-state "floating" condition and approximately 3.3 volts. A voltage at Node A varies between approximately 1.8 volts and 3.3 volts. Accordingly, respective voltages at the output of inverters 107 and 113 vary between approximately 1.8 volts and 3.3 volts.

More particularly, circuitry 100 translates a 0 volt voltage at DATA into a tri-state "floating" condition at INOUT. Also, circuitry 100 translates a 1.8 volt voltage at DATA into a steady-state 3.3 volt voltage at INOUT.

For example, if DATA has a voltage of approximately 0 volts, then transistor 102 is substantially turned off because its gate's voltage is less than one Vt (i.e. ~0.4 volts for transistor 102) above its source's voltage (i.e. GND=~0 volts). In that situation, if Node A has a voltage below approximately 2.9 volts, then transistor 106 is substantially turned on because its gate's voltage is more than one Vt (i.e. ~0.4 volts for transistor 106) below its source's voltage (i.e. OVdd=~3.3 volts). This increases the voltage at Node A to be at least approximately 2.9 volts.

As the voltage at Node A increases above approximately 1.8 volts, transistor 108 is substantially turned on because its gate's voltage is above its source's voltage (i.e. Vt=~0 volts for transistor 108, and Vdd=~1.8 volts). In that situation, (1) the output of inverter 107 has a voltage below approximately 2.9 volts and (2) transistor 112 is substantially turned on because its gate's voltage is more than one Vt (i.e. ~0.4 volts for transistor 112) below its source's voltage (i.e. OVdd=~3.3 volts). This further increases the voltage at Node A until (1) Node A has a steady-state voltage of approximately 3.3 volts=OVdd and (2) the output of inverter 107 has a steady-state voltage of approximately 1.8 volts=Vdd. Notably, as the voltage at Node A increases above approximately 2.9 volts, transistors 106 and 110 are substantially turned off, because their gate voltages are less than one Vt below their source voltages.

By comparison, if DATA has a voltage of approximately 1.8 volts, then transistor 102 is substantially turned on because its gate's voltage is more than one Vt (i.e. ~0.4 volts for transistor 102) above its source's voltage (i.e. GND=~0 volts). This reduces the voltage at Node B to be approximately 0 volts=GND. In that situation, transistor 104 is substantially turned on because its gate's voltage (i.e. Vdd=~1.8 volts) is more than one Vt (i.e. ~0.4 volts for transistor 104) above its source's voltage (i.e. GND=~0 volts).

Moreover, while Node A has a voltage below approximately 2.9 volts, transistor 106 is substantially turned on. Nevertheless, while DATA has a voltage of approximately 1.8 volts, transistor 106 operates to increase the voltage at Node A until Node A has a steady-state voltage of only approximately 1.8 volts. This is because, while DATA has a voltage of approximately 1.8 volts, transistors 102 and 104 are substantially turned on while transistor 106 is substantially turned on, so that transistors 102 and 104 operate to reduce the voltage at Node A until Node A has a steady-state voltage of only approximately 1.8 volts.

Accordingly, a direct current ("DC") path is formed between GND and OVdd through transistors 102, 104 and 106 in response to DATA having a voltage of approximately 1.8 volts. This DC path consumes a relatively high amount of power, because it continually conducts a significant amount of current while DATA has a voltage of approximately 1.8 volts. However, this DC path achieves an advantageous goal; more particularly, the voltage at Node A varies rapidly between approximately 1.8 volts and 3.3 volts in response to the voltage at DATA varying between approximately 1.8 volts and 0 volts, respectively.

In circuitry 100, approximately 2.4 volts is the predetermined limit on a maximum safe difference between a voltage at a transistor's gate and a voltage at a source/drain region of the transistor. By varying the voltage at Node A between approximately 1.8 volts and 3.3 volts, circuitry 100 advantageously ensures that no transistor's source/drain region has a voltage that differs from a voltage at the transistor's gate by more than the predetermined limit.

For example, the difference between transistor 106's source voltage (i.e. OVdd=~3.3 volts) and transistor 106's gate voltage (i.e. Node A=~1.8 volts to ~3.3 volts) is never more than approximately 1.5 volts. In this manner, circuitry 100 achieves enhanced reliability as compared to previous techniques for translating voltages, because gate oxides of transistors in circuitry 100 are less likely to be damaged.

In conclusion, the voltage at Node A varies between approximately 1.8 volts and 3.3 volts in response to the voltage at DATA varying between approximately 1.8 volts and 0 volts, respectively. In response to Node A having a steady-state voltage of ~1.8 volts, (1) the output of inverter 107 has a steady-state voltage of ~3.3 volts and (2) the output of inverter 113 has a steady-state voltage of ~1.8 volts. By comparison, in response to Node A having a steady-state voltage of ~3.3 volts, (1) the output of inverter 107 has a steady-state voltage of ~1.8 volts and (2) the output of inverter 113 has a steady-state voltage of ~3.3 volts.

In response to the output of inverter 113 having a steady-state voltage of ~3.3 volts, transistor 120 is substantially turned off because its gate's voltage is less than one Vt (i.e. ~0.4 volts for transistor 120) below its source's voltage (i.e. OVdd=~3.3 volts). In such a situation, INOUT has a tri-state "floating" condition, and the voltage at Node C somewhat varies according to the voltage at INOUT. For example, if INOUT has a voltage of 0 volts, then Node C's voltage is less than ~2.2 volts, because transistor 118 is substantially turned on in a forward direction if its gate's voltage (i.e. Vdd=~1.8 volts) is more than one Vt (i.e. ~0.4 volts for transistor 118) below Node C's voltage. Alternatively, if INOUT has a voltage of 3.3 volts, then Node C's voltage is approximately equal to INOUT's voltage, because transistor 118 is substantially turned on in a reverse direction if its gate's voltage is more than one Vt below INOUT's voltage.

By comparison, in response to the output of inverter 113 having a steady-state voltage of ~1.8 volts, transistor 120 is substantially turned on because its gate's voltage is more than one Vt below its source's voltage. This increases the voltage at Node C until its voltage is approximately 3.3 volts=OVdd. As the voltage at Node C increases above approximately 2.2 volts, transistor 118 is substantially turned on because its gate's voltage is more than one Vt below its source's voltage (i.e. Node C>~2.2 volts). This increases the voltage at INOUT until its voltage is approximately equal to Node C's voltage. In this manner, INOUT's voltage eventually increases along with Node C's voltage to a steady-state voltage of ~3.3 volts=OVdd.

Accordingly, as discussed hereinabove, circuitry 100 includes first semiconductor circuitry (e.g. transistor 102) for receiving a first signal (e.g. a signal at DATA) having a first voltage between a voltage A and a voltage B, where A=~0 volts and B=~1.8 volts. Further, circuitry 100 includes second semiconductor circuitry (e.g. transistors 104 and 106) for outputting a second signal (e.g. a signal at Node A) having a second voltage between a voltage C and a voltage D in response to the first signal, where C=~1.8 volts and D=~3.3 volts. Thus, C is greater than A, and D is greater than B. Also, in the illustrative embodiment, B is substantially equal to C.

Also, circuitry 100 includes third semiconductor circuitry (e.g. inverters 107 and 113, together with transistors 118 and 120) for outputting a third signal (e.g. a signal at INOUT) having either a tri-state condition or a third voltage (e.g. voltage D) in response to the second signal (e.g. the signal at Node A). Moreover, as discussed hereinabove, E=~2.4 volts, where E is the predetermined limit on a maximum safe difference between a voltage at a transistor's gate (i.e. control node) and a voltage at a source/drain region (i.e. conducting node) of the transistor (i.e. control device) within circuitry 100. Thus, B−A<E, and D−C<E, and B−C<E.

In summary, circuitry 100 translates (1) a steady-state 0 volt voltage at DATA into a tri-state "floating" condition at INOUT and (2) a steady-state 1.8 volt voltage at DATA into a steady-state 3.3 volt voltage at INOUT. Advantageously, circuitry 100 has been successfully tested.

Although an illustrative embodiment and its advantages have been described in detail hereinabove, they have been described as example and not as limitation. Various changes, substitutions and alterations can be made in the illustrative embodiment without departing from the breadth, scope and spirit of the present inventions.

What is claimed is:

1. Circuitry, comprising:

first semiconductor circuitry for receiving a first signal having a first voltage between a voltage A and a voltage B;

second semiconductor circuitry integral with said first semiconductor circuitry for outputting a second signal having a second voltage between a voltage C and a voltage D in response to said first signal, wherein C is greater than A, and D is greater than B; and third semiconductor circuitry coupled to said second semiconductor circuitry for outputting a third signal having either a tri-state condition or a third voltage in response to said second signal.

2. The circuitry of claim 1 wherein said third voltage is substantially equal to said voltage D.

3. The circuitry of claim 1 wherein said second semiconductor circuitry includes a direct current path for continually conducting current in response to said first signal having said first voltage.

4. The circuitry of claim 1 wherein said second semiconductor circuitry includes a direct current path for continually conducting current in response to said first signal having said first voltage substantially equal to said voltage B.

5. A method, comprising:

with first semiconductor circuitry, receiving a first signal having a first voltage between a voltage A and a voltage B;

with second semiconductor circuitry, outputting a second signal having a second voltage between a voltage C and a voltage D in response to said first signal, wherein C is greater than A, and D is greater than B; and with third semiconductor circuitry, outputting a third signal having either a tri-state condition or a third voltage in response to said second signal.

6. The method of claim 5 wherein said third voltage is substantially equal to said voltage D.

7. The method of claim 5 wherein said outputting comprises continually conducting current through a direct current path of said second semiconductor circuitry in response to said first signal having said first voltage.

8. The method of claim 5 wherein said outputting comprises continually conducting current through a direct current path of said second semiconductor circuitry in response to said first signal having said first voltage substantially equal to said voltage B.

* * * * *